United States Patent
Waldo

(10) Patent No.: US 11,687,213 B1
(45) Date of Patent: Jun. 27, 2023

(54) OBJECT ORIENTED GRAPHICAL USER INTERFACE FOR A TEST AND MEASUREMENT INSTRUMENT

(71) Applicant: Tektronix, Inc., Beaverton, OR (US)

(72) Inventor: Gary J. Waldo, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 17/385,859

(22) Filed: Jul. 26, 2021

Related U.S. Application Data

(62) Division of application No. 16/430,271, filed on Jun. 3, 2019, now abandoned.

(60) Provisional application No. 62/681,649, filed on Jun. 6, 2018, provisional application No. 62/681,609, filed on Jun. 6, 2018.

(51) Int. Cl.
| | | |
|---|---|---|
| *G06F 3/04817* | (2022.01) | |
| *G06F 3/0482* | (2013.01) | |
| *G06F 3/04845* | (2022.01) | |

(52) U.S. Cl.
CPC ........ *G06F 3/0482* (2013.01); *G06F 3/04817* (2013.01); *G06F 3/04845* (2013.01); *G06F 2203/04803* (2013.01)

(58) Field of Classification Search
CPC ............... G06F 3/0482; G06F 3/04845; G06F 3/04817; G06F 2203/04803
See application file for complete search history.

(56) References Cited

U.S. PATENT DOCUMENTS

| | | | | |
|---|---|---|---|---|
| 9,104,789 | B2 * | 8/2015 | Gross | G16H 40/67 |
| 2011/0080293 | A1 * | 4/2011 | Tanishima | G16H 40/63 340/573.1 |
| 2014/0039833 | A1 * | 2/2014 | Sharpe, Jr. | G05B 19/4184 702/183 |
| 2017/0242950 | A1 * | 8/2017 | Cockrell | H04L 67/02 |
| 2019/0320988 | A1 * | 10/2019 | Ahmed | A61B 5/742 |

OTHER PUBLICATIONS

WaveRunner 6 Zi Oscilloscopes Operator's Manual. Teledyne LeCroy, Inc. May 2017. pp. 1-175 (Year: 2017).*
Tektronix, Inc., "5 Series MSO Mixed Signal Oscilloscope: 5-minute Overview," Jun. 5, 2017, video 4'27", YouTube.com, available at https://www.youtube.com/watch?v=nwVN-R6yovU, last accessed Jul. 27, 2021.

* cited by examiner

*Primary Examiner* — Hien L Duong
(74) *Attorney, Agent, or Firm* — Miller Nash LLP; Andrew J. Harrington

(57) ABSTRACT

A test and measurement instrument including a display and one or more processors configured to display on the display a waveform viewing area with a vertical dimension and an adjustable horizontal dimension, the test and measurement instrument configured to display one or more waveforms in the waveform viewing area, a global settings readout bar located vertically adjacent to the waveform viewing area, the global settings readout bar including a first selectable information badge, wherein when the first selectable information badge is selected, displaying a first menu originating from the first selectable information badge to modify a setting of the test and measurement instrument related to the first selectable information badge. The first selectable information badge including a warning indicator when an error or safety condition occurs.

20 Claims, 12 Drawing Sheets

OBJECT ORIENTED GRAPHICAL USER INTERFACE FOR A TEST AND MEASUREMENT INSTRUMENT

PRIORITY

This application is a divisional of U.S. patent application Ser. No. 16/430,271, filed Jun. 3, 2019, which claims benefit of U.S. Provisional Application No. 62/681,649, titled "GRAPHICAL USER INTERFACE FOR A TEST AND MEASUREMENT INSTRUMENT," filed on Jun. 6, 2018, and U.S. Provisional Application No. 62/681,609, titled "ALERTING A USER TO A CONDITION IN A TEST AND MEASUREMENT SYSTEM," filed on Jun. 6, 2018, each of which is incorporated herein by reference in its entirety.

TECHNICAL FIELD

This disclosure is directed to systems and methods related to test and measurement systems, and in particular, to a graphical user interface displayed on a display of a test and measurement system.

BACKGROUND

Conventional test and measurement instruments often have a display and graphical user interface (GUI) that are confusing and/or time consuming for a user to navigate. For example, conventional GUIs may require a user to have learned a test and measurement instruments menu structure and/or a series of front panel/bezel button presses to get to a particular menu that enables a feature or capability the user is looking for. That is, many features and capabilities of the test and measurement instrument are not directly accessible to the user, and require navigating through multiple menus.

Each time a user needs to add or modify a capability or feature of the test and measurement instrument, the user must stop and recall the steps needed to get what the user desires, and then further take the time to perform the needed actions to enable or modify the feature or capability. When a user does this tens, hundreds, or even thousands of times over a course of a debug session or a design project, the seconds add up to hours and days of wasted time.

Embodiments of the disclosure address these and other deficiencies of the prior art.

BRIEF DESCRIPTION OF THE DRAWINGS

Aspects, features and advantages of embodiments of the present disclosure will become apparent from the following description of embodiments in reference to the appended drawings in which.

DESCRIPTION

Disclosed herein is a test and measurement instrument including a display and one or more processors configured to display on the display a waveform viewing area with a vertical dimension and an adjustable horizontal dimension, the test and measurement instrument configured to display one or more waveforms in the waveform viewing area, a global settings readout bar located vertically adjacent to the waveform viewing area, the global settings readout bar including a first selectable information badge, wherein when the first selectable information badge is selected, displaying a first menu originating from the first selectable information badge to modify a setting of the test and measurement instrument related to the first selectable information badge. The first selectable information badge may include a warning indicator when an error or safety condition occurs.

As mentioned above, conventional GUIs of test and measurement instruments, such as oscilloscopes, spectrum analyzers, etc., require a user to have learned the test and measurement instrument's menu structure or learned a series of front panel and/or bezel button presses to get to a particular menu that allows a user to enable or modify a feature or capability the user requires to test their device under test. In other words, conventional GUIs require a user to stop and think to recall the steps needed to get to what is needed, or even worse, requires a user to search through the entirety of the menu structure to find a feature the user desires to use or modify.

Embodiments of the disclosure, however, are directed to an object-oriented user interface that displays or places the most commonly used features of the test and measurement instrument directly on the GUI without having to move through a series of menu functions to find the particular feature. That is, the most commonly used features may be located directly at the bottom of the display, as will be discussed in more detail below, and other commonly performed analysis features may be shown as a group of activation buttons on another portion of the GUI.

Figure 1:
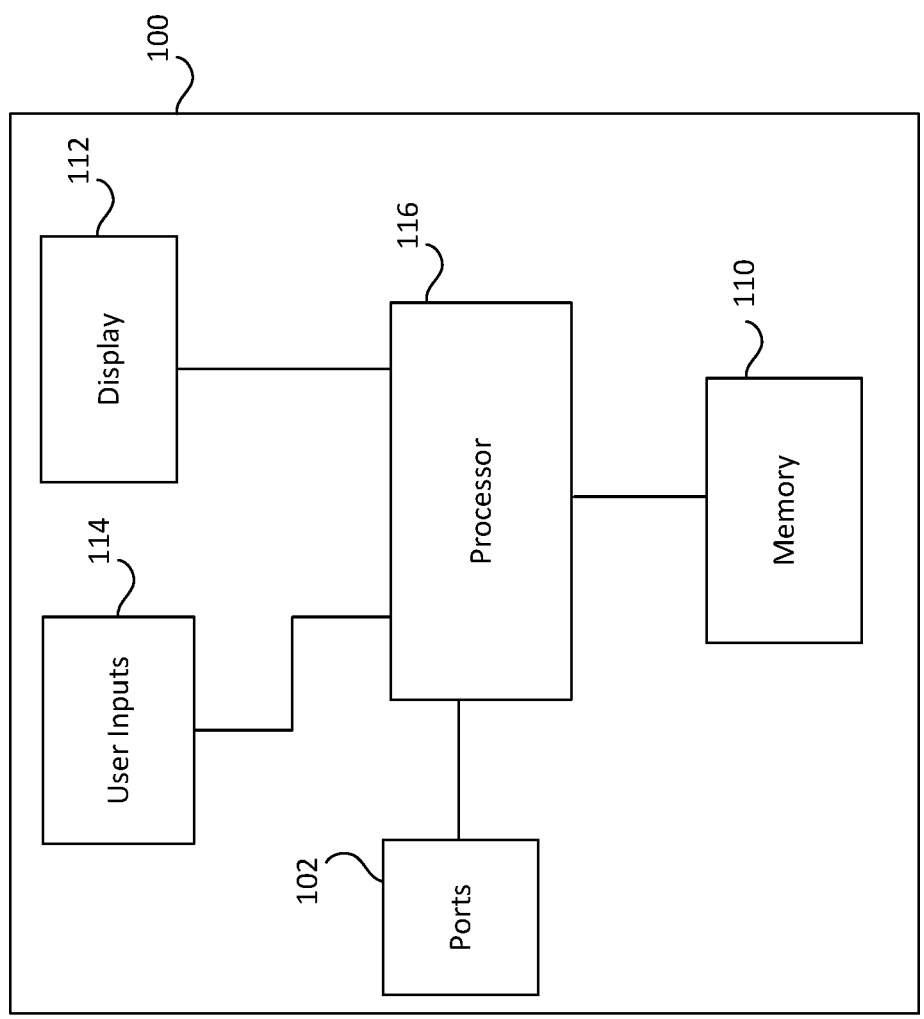
FIG. 1 is a block diagram of a test and measurement instrument according to embodiments of the disclosure.

FIG. 1 is a block diagram of an example test and measurement instrument 100, such as an oscilloscope, for implementing embodiments of the disclosure disclosed herein. The test and measurement instrument 100 includes one or more ports 102 which may be any electrical signaling medium. Ports 102 may include receivers, transmitters, and/or transceivers. Each port 102 is a channel of the test and measurement instrument 100. The ports 102 are coupled with one or more processors 116 to process the signals and/or waveforms received at the ports 102 from one or more devices under test. Although only one processor 116 is shown in FIG. 1 for ease of illustration, as will be understood by one skilled in the art, multiple processors 116 of varying types may be used in combination, rather than a single processor 116.

The ports 102 can also be connected to a measurement unit in the test instrument 100, which is not depicted for ease of illustration. Such a measurement unit can include any component capable of measuring aspects (e.g., voltage, amperage, amplitude, etc.) of a signal received via ports 102. The test and measurement instrument may include additional hardware and/or processors, such as conditioning circuits, an analog to digital converter, and/or other circuitry to convert a received signal to a waveform for further analysis. The resulting waveform can then be stored in a memory 110, as well as displayed on a display 112.

The one or more processors 116 may be configured to execute instructions from memory 110 and may perform any methods and/or associated steps indicated by such instructions, such as displaying and modifying the GUI of embodiments of the disclosure. Memory 110 may be implemented as processor cache, random access memory (RAM), read only memory (ROM), solid state memory, hard disk drive(s), or any other memory type. Memory 110 acts as a medium for storing data, computer program products, and other instructions.

User inputs 114 are coupled to the one or more processors 116. User inputs 114 may include a keyboard, mouse, trackball, touchscreen, and/or any other controls employable by a user to interact with a GUI on the display 112. The display 112 may be a digital screen, a cathode ray tube based display, or any other monitor to display waveforms, measurements, and other data to a user. While the components of test instrument 100 are depicted as being integrated within test and measurement instrument 100, it will be appreciated by a person of ordinary skill in the art that any of these components can be external to test instrument 100 and can be coupled to test instrument 100 in any conventional manner (e.g., wired and/or wireless communication media and/or mechanisms). For example, in some embodiments, the display 112 may be remote from the test and measurement instrument 100.

Figure 2:
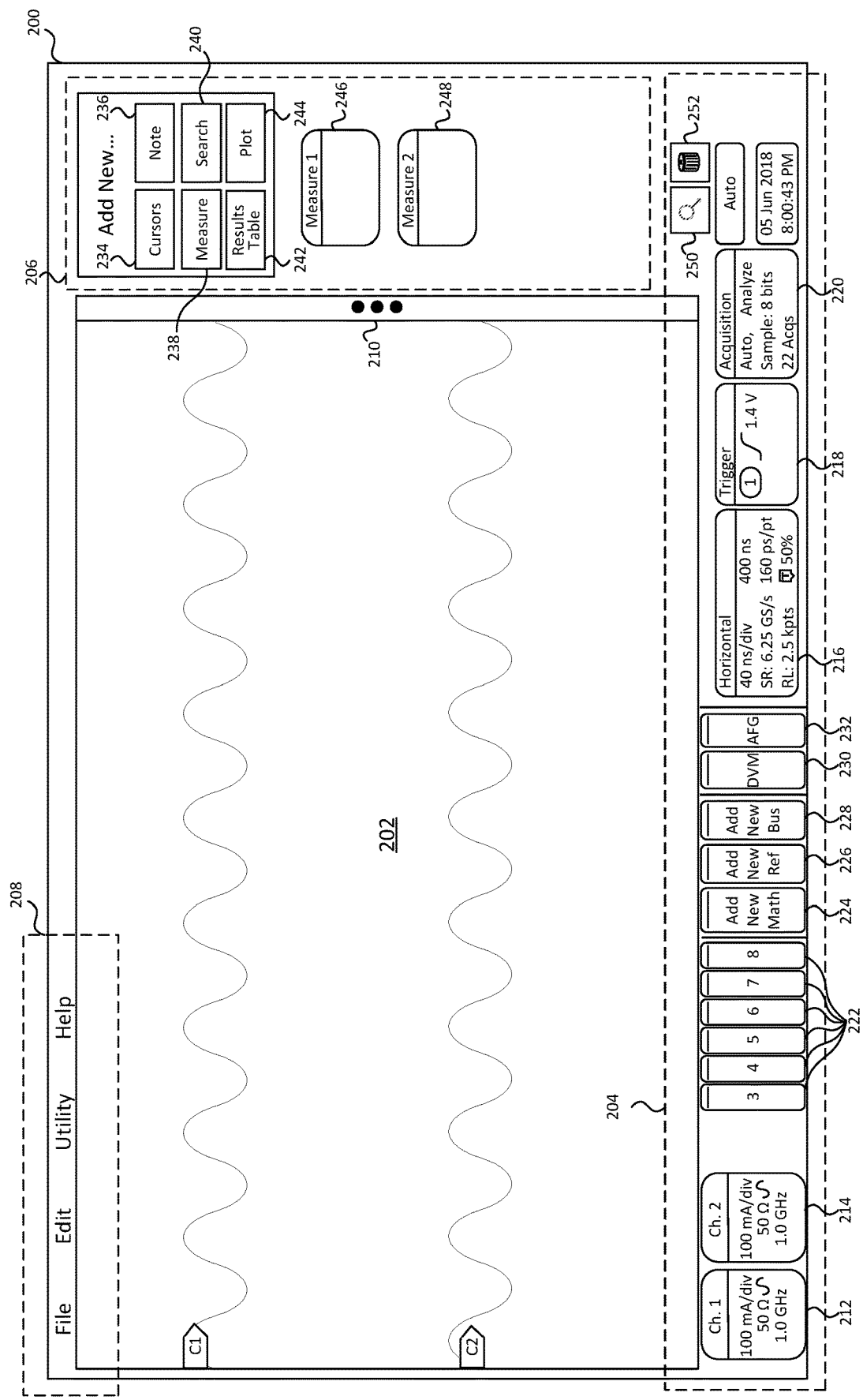
FIG. 2 illustrates an example of an object-oriented GUI displayed on the display of the test and measurement instrument of FIG. 1 according to some embodiments of the disclosure.

FIG. 2 illustrates an example object-oriented GUI 200 of a test and measurement instrument which may be displayed on the display 112 of the test and measurement instrument, and may be interacted with using one or more user inputs 114 according to some embodiments of the disclosure.

The object-oriented GUI 200 may include a waveform display area 202, a settings bar 204, which may also be referred to herein as a Global Settings Readout Bar (GSRB) 204, and a results bar 206, which may also be referred to herein as a Results Readout Bar (RRB) 206. The object-oriented GUI 200 may also include a menu bar 208.

The object-oriented GUI 200 is arranged so that information is intuitively organized and presented to a user in a manner that maximizes the waveform viewing area 202. Conventional user interfaces often lack hierarchy based on importance, and instead seem to place settings based on where they best fit spatially on the display. And in most conventional user interfaces, key parameters are not labeled; instead, these conventional user interfaces leave it to the user to determine what a parameter means based on the units provided or potentially what other parameters are presented with it. In contrast, embodiments of the object-oriented GUI 200 of the disclosure include a unifying construct of badges, buttons, and other objects. Badges and objects, as will be discussed in more detail below, are distinct objects displayed on the object-oriented GUI 200 that may display relevant information and can be directly interacted with by a user. A badge may display an identifier identifying the badge as being associated with a feature, function, or capability of the test and measurement instrument 100. For example, a badge may display an identifier of "Ch. 1" indicating that the badge is associated with channel one of the test and measurement instrument 100 ports 102. Badges may also optionally display a color that is visually associated with the corresponding function of the test and measurement instrument. For example, a waveform input on channel one may be displayed in the same color as the badge for channel one. Badges, as will be discussed below, may also display information related to the type of badge.

Figure 3:
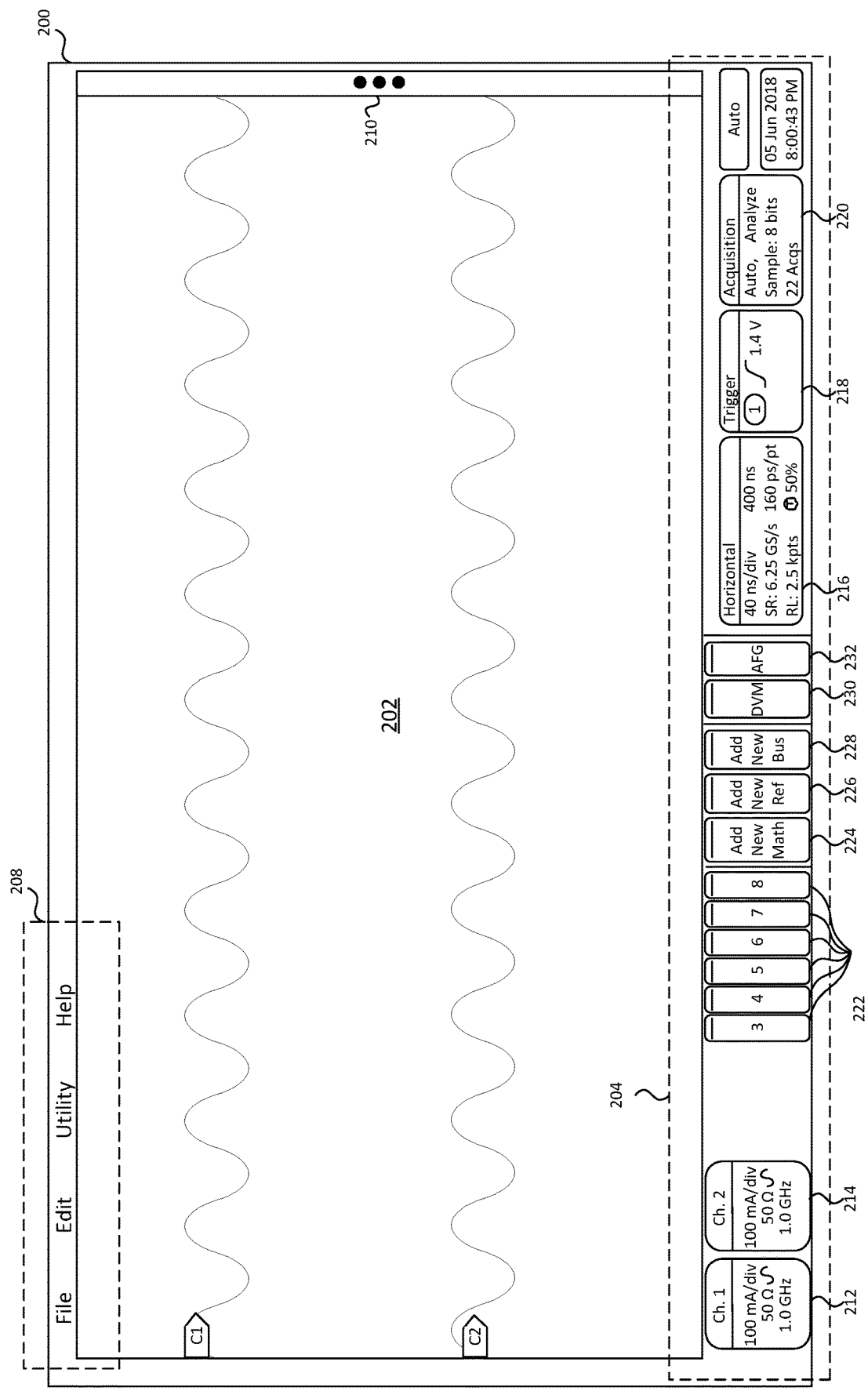
FIG. 3 illustrates another example of the object-oriented GUI with an expanded waveform viewing area displayed on the display of the test and measurement instrument of FIG. 1 according to some embodiments of the disclosure.

The waveform display area 202 may be expandable in the horizontal dimension. The GSRB 204 may also be fixed, while the RRB 206 is collapsible, as indicated by the handle 210 on the object-oriented GUI 200. A user may swipe away, if the display is a touch screen display, or pull to the side, the RRB 206 using the handle 210 on the display. When the RRB 206 is collapsed, the waveform display area 202 is extended in the horizontal direction in the area that was previously covered by the now collapsed RRB 206, as shown in FIG. 3. As shown in FIG. 3, the handle 210 may stay on the display so that a user can then swipe back to the left, or use a cursor to move the handle 210 to the left to expand and view the RRB 206, which returns the waveform display area 202 back to the size shown in FIG. 2. The vertical dimension, however, of the waveform display area 202 maintains the same vertical distance.

As can be seen in FIGS. 2-10, a user can interact with the various objects on the object-oriented GUI 200 to immediately access various features, functionalities, and capabilities of the test and measurement instrument, without having to navigate a number of menus to do so. For example, starting with the GSRB 204, a number of badges 212, 214, 216, 218, and 220 are displayed on the object-oriented GUI 200. As mentioned above, a badge is a distinct object displayed in the GUI 200 that is labeled, displays the relevant information about the item to which the badge is related, and can be directly interacted with by a user to modify the configuration or settings of the item to which the badge is related. Embodiments may be particularly useful in a test and measurement instrument 100 having a combination touchscreen display since the badges, buttons, and other objects to be interacted with can be sized appropriately, i.e. large enough, to provide easy and convenient touch targets for a user.

Badges 212 and 214 indicate active channels of the test and measurement instrument 100 from ports 102. As will be discussed in more detail below, a user may select one of the channel badges 212 and 214 to modify settings of the channel. Badge 216 indicates the horizontal (also referred to as timebase) settings of the test and measurement instrument 100, and may also be expanded to modify timebase settings of the test and measurement instrument 100, as will be discussed in further detail below. Badge 218 indicates trigger settings of the test and measurement instrument 100, while badge 220 is related to acquisition settings of the test and measurement instrument 100, each of which may also be expanded to modify the respective settings by interacting with the badges 218 and 220, respectively.

The GSRB 204 may also include a number of buttons 222, 224, 226, 228, 230, and 232. These buttons 222, 224, 226, 228, 230, and 232 may be selected to activate a feature of the test and measurement instrument, and once the feature is selected, a badge will be generated for the selected feature. Buttons 222 are presented for each of the currently inactive channels of the test and measurement instrument 100, which correspond to specific ports 102 of the test and measurement instrument 100. A user may select one of buttons 222 to activate the corresponding input channel, which causes the test and measurement instrument 100 to display a badge corresponding to the activated channel in the GSRB 204 and to display a portion of the input signal on the activated channel as a waveform in the waveform display area 202 associated with the activated channel badge. In some embodiments, the test and measurement instrument 100 may sense activity occurring on an inactive channel, for example, the test and measurement instrument 100 may detect when a user connects a probe to an inactive channel, and automatically activate the channel and display the corresponding channel badge and waveform. Button 224 allows a user to add a new math waveform, while button 226 may be selected by a user to add a new reference waveform. Button 228, if selected, will add a new bus waveform. Button 230 activates a digital volt meter (DVM) function of the test and measurement instrument 100, while button 232 allows a user to activate an arbitrary function generator (AFG) function of the test and measurement instrument 100.

While the specific buttons and badges discussed above are illustrated in FIG. 2, embodiments of the disclosure are not limited to these particular badges and buttons, as illustrated. Rather, any buttons and/or badges related to the most commonly used features of a test and measurement instrument 100 may be displayed in the GSRB 204 to be readily accessed by a user. For example, an oscilloscope, spectrum analyzer, arbitrary waveform or function generators, etc., may all have different commonly used features or functions, and as such, the badges displayed on each of the object-oriented GUIs may be different. In some embodiments, a user may select in the menu bar 208 which functions to display in the GSRB 204.

The RRB 206, as mentioned above, may be located on the right side of the waveform viewing area 202 and may be collapsible to allow the waveform viewing area 202 to expand. Results from features such as measurements and searches may be displayed, for example, as badges, in the RRB 206. Each of these badges not only provide readouts full of useful information, but they also provide a target object for a user to interact with, such as by double clicking or touching the badge to configure each of the items via contextual menus.

The RRB 206 may include a number of objects or buttons for adding a new cursor object 234, a new note object 236, a new measurement object 238, a new search object 240, a new results table object 242, and a new plot object 244, for example. A user may interact with any of the objects 234, 236, 238, 240, 242, and 244 to add a feature. When a new measurement object 230 or a new search object 240 is added, a badge may be displayed in the RRB 206. For example, in FIG. 2, two measurement badges 246 and 248 are shown in the RRB 206. A user may interact with either badge 246 and 248 to modify a setting of the measurement. If a search is performed, a search badge may also be present in the RRB 206, which a user may interact with to modify any settings of the search.

In some embodiments, if the RRB 206 has been collapsed by swiping handle 210, and then re-expanded by swiping handle 210, the RRB 206 is not placed overlapping any of the waveform viewing area 202. Rather, the waveform viewing area 202 size is reduced in the horizontal dimension only to accommodate the expanded RRB 206.

The new cursor object 234 can be selected by a user and dragged to any target, such as any waveform in the waveform viewing area 202, or a plot that has been added using the new plot object 244. When the new cursor object 234 is released on a target, a cursor of a default type may be added to the selected target. If a cursor is already active for the target, a new cursor will not be added. In some embodiments, the new cursor object 234 may change colors, such as turn green, when it is placed over a valid target or over a valid plot.

The new note object 236 may also be selected and dragged by a user anywhere on the display. In some embodiments, the new note object 236 may change colors when selected. When the new note object 236 is released, an annotation at the dragged location of the new note object 236 may be added which allows a user to type a note, such as labeling a waveform with a signal name or source of the input signal corresponding to the waveform, using user inputs 114. In some embodiments, an annotations tool contextual menu may also be added next to the annotation to enable quick and easy formatting.

The new measurement object 238 may also be selected and dragged by a user toward a target, such as a waveform or a plot. Similar to the new cursor object 234, the new measurement object may change colors when placed over a suitable target, such as a valid waveform or plot. Upon release of the new measurement object 238 by a user on a valid waveform or plot, an add measurement contextual menu may be shown which provides a list of measurements that are relevant for both the waveform type and the view type. When the measurement is set, a measurement badge may also be added the RRB 206, such as seen in FIG. 2.

The new search object 240 may also be selected and dragged by a user toward a target, the target including any waveform in the waveform viewing area 202. Similar to other objects, the new search object 240 may change color when selected and upon release, may activate a next sequentially numbered search with the selected source and otherwise default settings of the target waveform. A search results badge may be added to the RRB 206 and a contextual menu may be opened to allow a user to further configure the desired search.

The examples discussed above are merely some examples of objects and buttons that may be clicked and dragged or touched and dragged. A user may click and drag (CAD) or touch and drag (TAD) different badges and objects within the GUI 200 to immediately provide a setting, such as trigger position, trigger level, vertical position, etc. Some badges and objects can be CAD/TAD to activate a feature or delete something.

When a user drags an object, the original badge or object may remain in place, but be shown in a selected state, such as grayed out or bolded, so a user can easily identify from where the badge or object they are dragging originated. A ghost, or floating, version of the object or badge moves along with either a mouse or a user's finger during the drag operation. If a badge or object is dragged to a valid target and released, then a specified action will take place, such as a measurement turned on, a waveform deleted, etc. If the badge or object is dragged to an invalid target and released, nothing happens and the badge or object returns to its original position. In some embodiments, the floating or ghost image of the badge or object may be modified to indicate a valid or invalid target. For example, the badge or object may turn green when placed over a valid target or may turn red when place over an invalid target.

The menu bar 208 may be located above the waveform viewing area 202 and may be similar to traditional computer-like drop down menus, which may allow a user to access less commonly used features or capabilities, or settings of the test and measurement instrument 100 that are not directly associated with any of the GUI objects discussed above, for example, the instrument's IP address or unique identifier. In some embodiments, to maximize the waveform viewing area 202, the menu bar 208 may not appear until a user places a cursor at the top edge of the waveform viewing or swipes down from the top edge of the waveform viewing area 202.

The object-oriented GUI 200 may also include miscellaneous controls, such as a zoom control object 250 and a trash object 252. If the zoom control object 250 is selected by a user, a user may draw a box in the waveform viewing area 202 to zoom in on that particular area. Any badges a user may wish to remove may be dragged to the trash object 252, which results in the feature associated with that badge being deleted or removed from the object-oriented GUI 200. Other objects that may be dragged to the trash object 252 to be deleted may include, for example, measurements, notes, plot views, application views, results views, etc. For example, if a user is finished with channel two, the user may drag the channel two badge 214 to the trash object 252, and the channel two badge 214 will be removed and the waveform associated with channel two will not be displayed in the waveform viewing area 202. Further, a button 222 will be displayed again for unused channel two.

Figure 4:
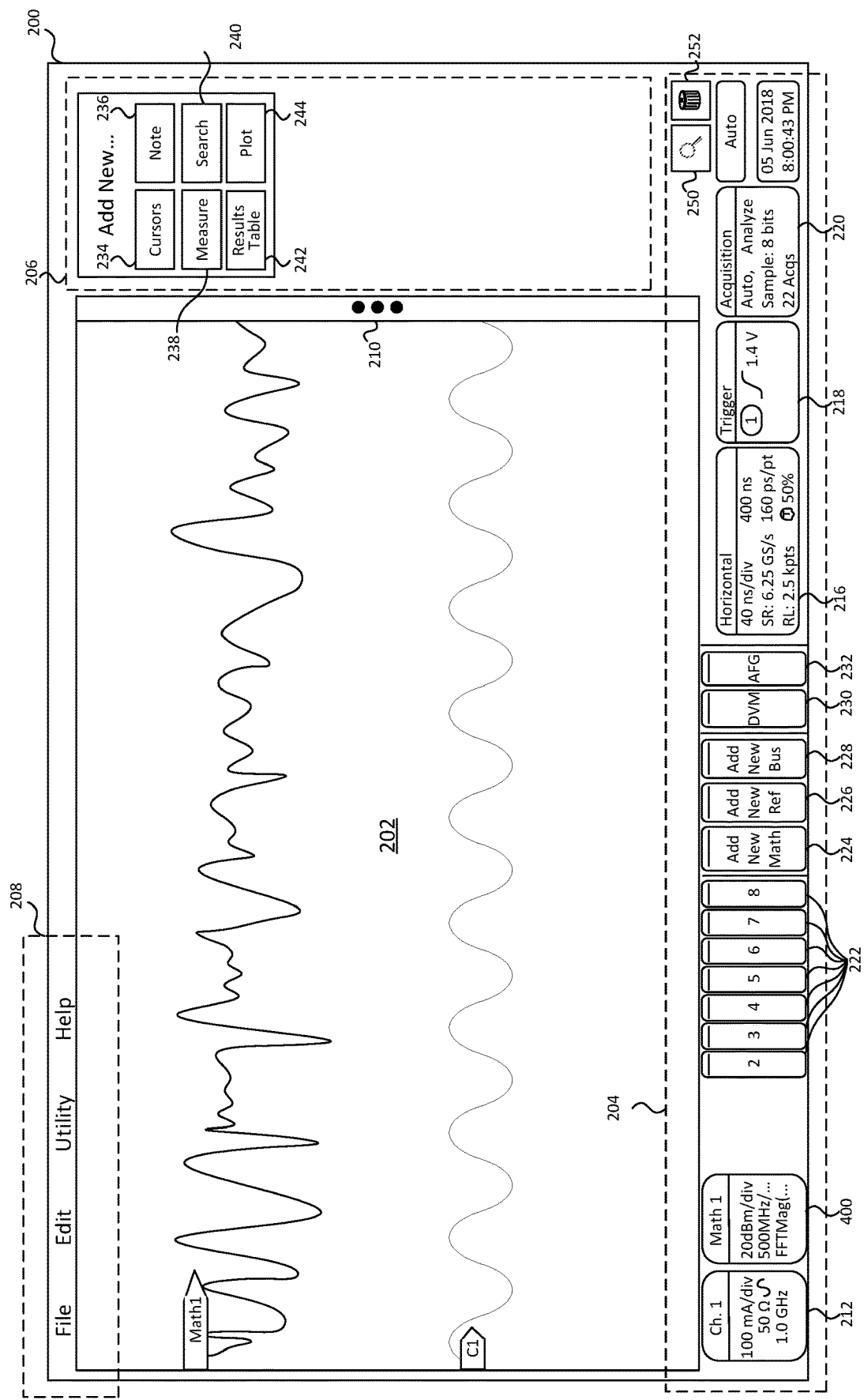
FIG. 4 illustrates an example of the object-oriented GUI with a math function waveform displayed on the display of the test and measurement instrument of FIG. 1 according to some embodiments of the disclosure.
Figure 5:
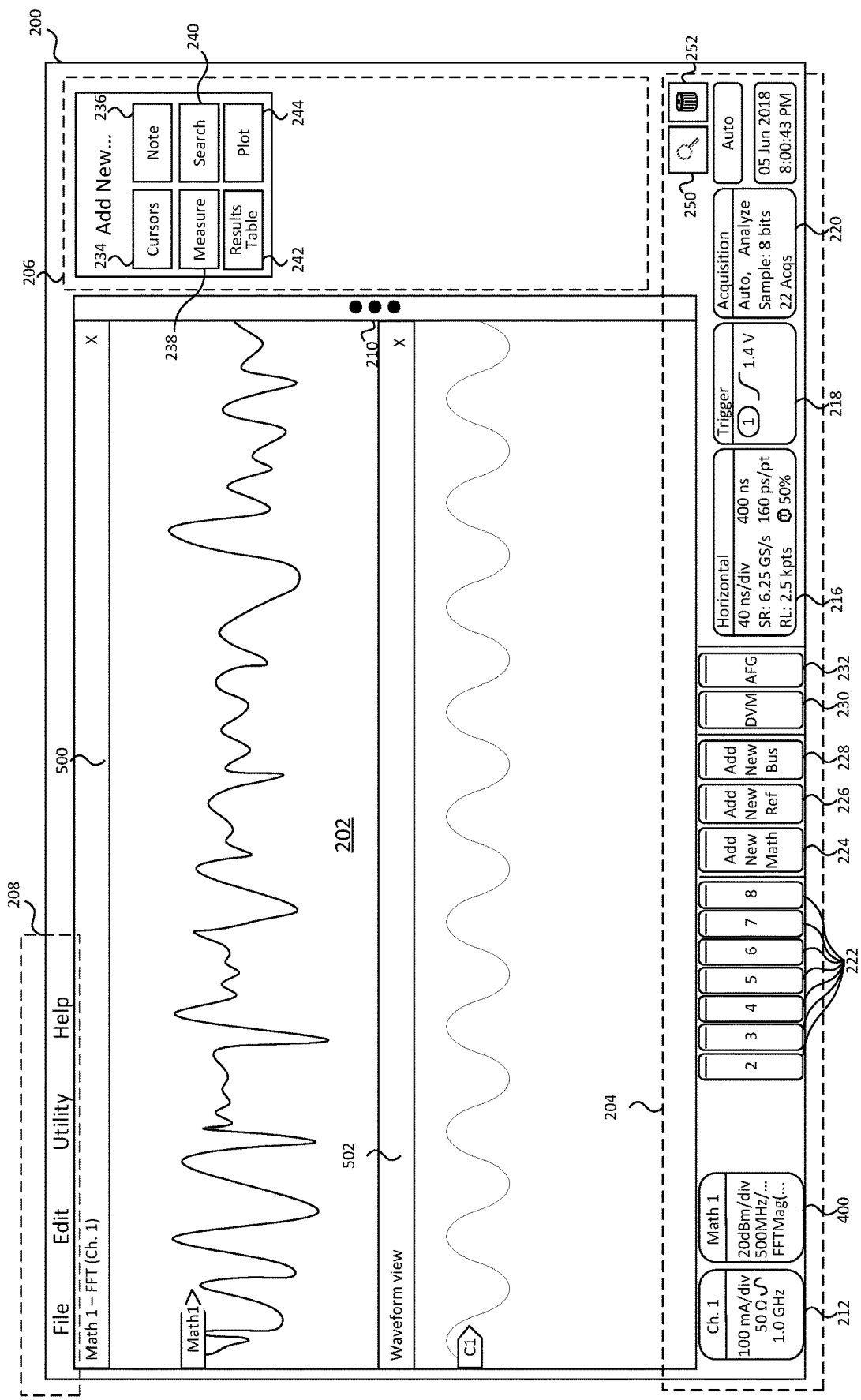
FIG. 5 illustrates an example of the object-oriented GUI with a math function waveform displayed in its own window in the waveform viewing area on the display of the test and measurement instrument of FIG. 1 according to some embodiments of the disclosure.

FIG. 4 illustrates an example of the object-oriented GUI 200 when a math function is enabled. As can be seen in FIG. 4, a user selected the add new math button 224, and a math badge 400 has been added and the math waveform is shown in the waveform viewing area 202. In the example depicted in FIG. 4, the math waveform associated with badge 400 is a spectral waveform created by the test and measurement instrument 100 performing a Fast Fourier Transform (FFT) of the input signal on channel one. In some embodiments, the math waveform and any active channels may be shown in the same window of the waveform viewing area 202. In other embodiments, the math waveforms and the channel waveforms, may be in separate windows of the waveform viewing area 202, as illustrated in FIG. 5. In FIG. 5, a math window 500 is provided which displays math 1 waveform. If other math waveforms are added by the user, the additional math waveforms may also be displayed in this math window 500 or they may be displayed in a separate math window. The channel waveforms may be displayed in a waveform view 502.

Figure 6:
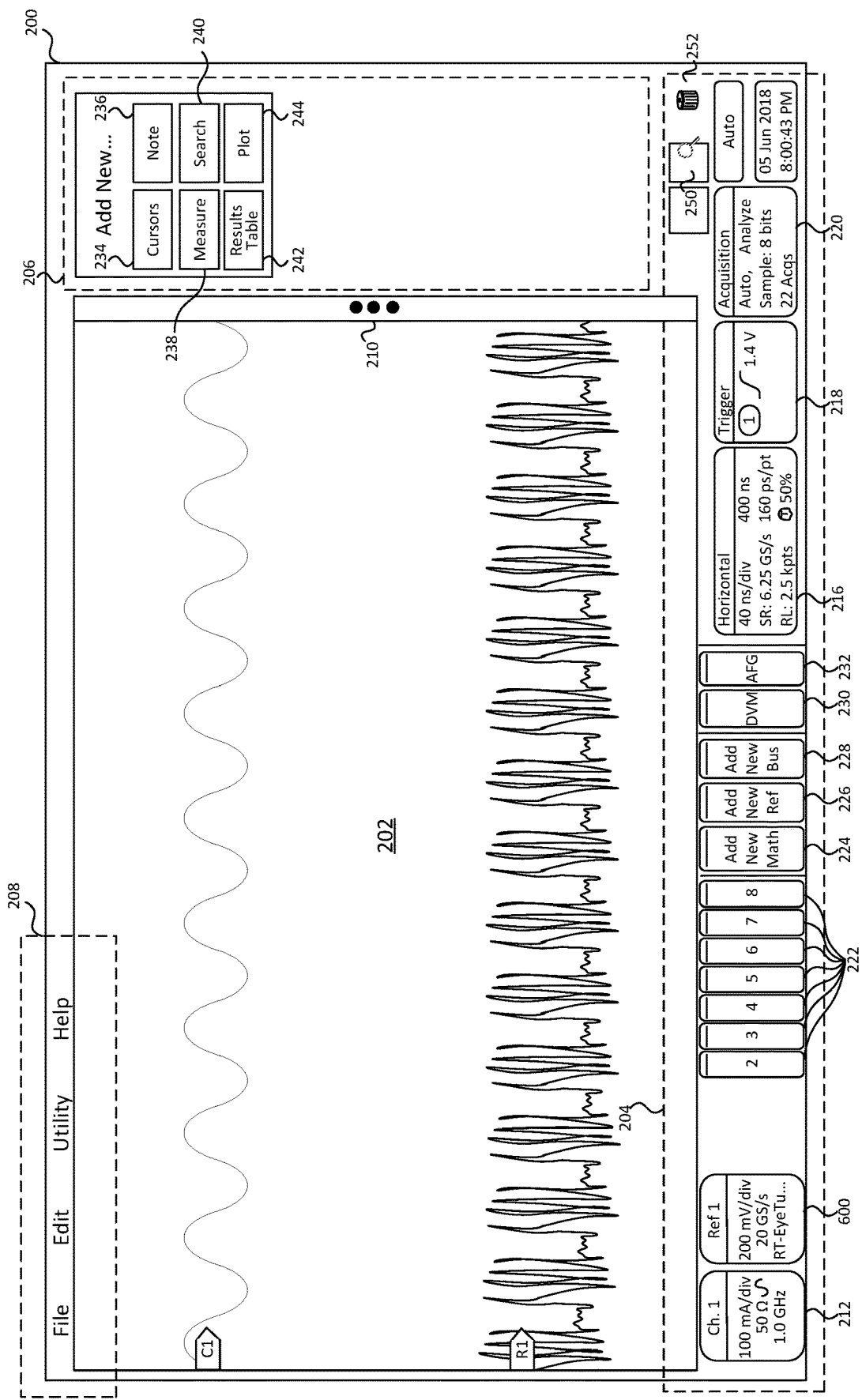
FIG. 6 illustrates an example of the object-oriented GUI with a reference function waveform displayed on the display of the test and measurement instrument of FIG. 1 according to some embodiments of the disclosure.
Figure 7:
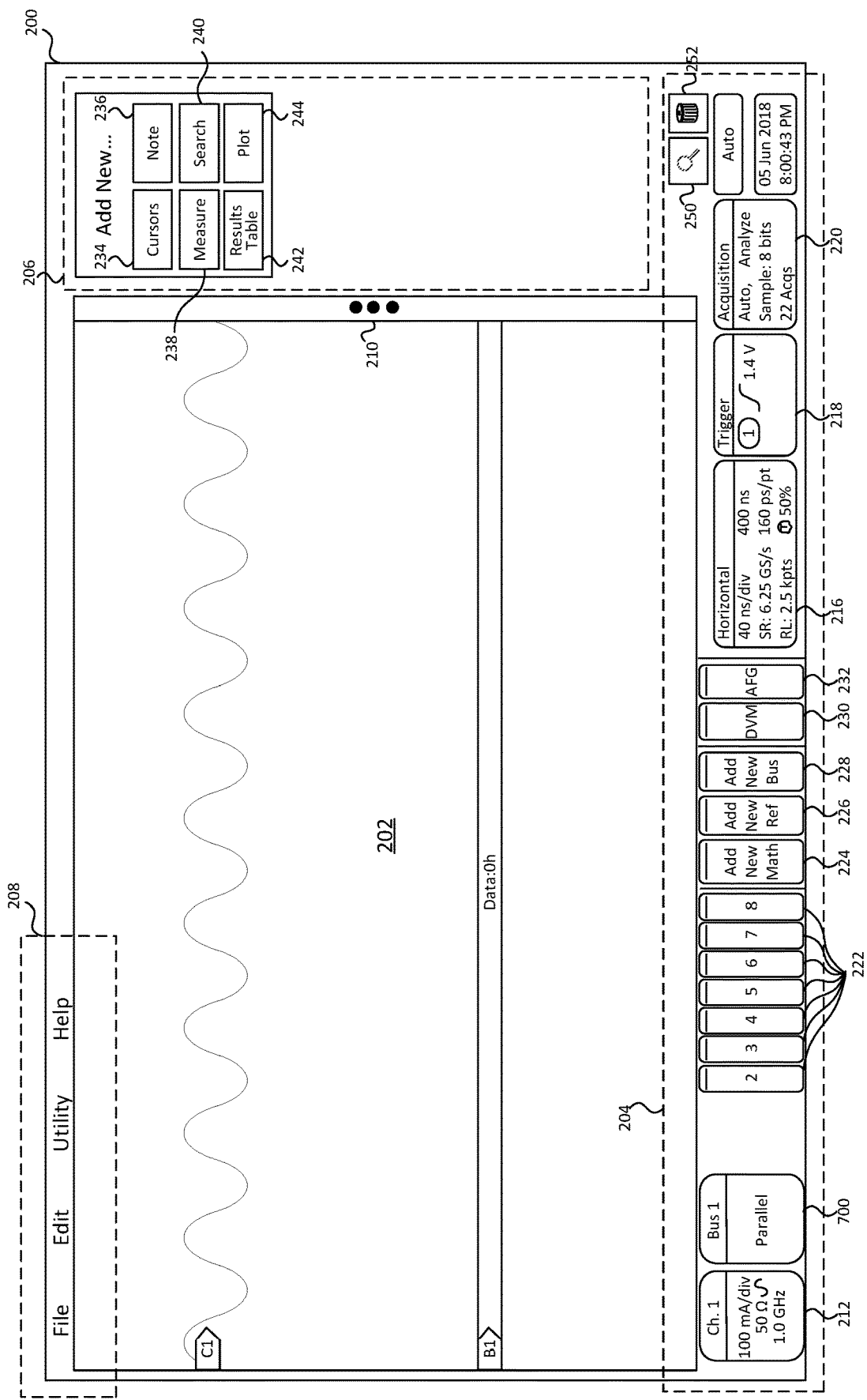
FIG. 7 illustrates an example of the object-oriented GUI with a bus waveform displayed on the display of the test and measurement instrument of FIG. 1 according to some embodiments of the disclosure.

FIG. 6 illustrates an example of the object-oriented GUI 200 when a reference waveform has been added by a user selecting the add new reference button 226. Similar to the math badge 400 of FIGS. 4 and 5, in response to selecting the new reference button 226, a reference badge 600 corresponding to the reference waveform is added to the GSRB 204. The reference waveform may be, for example, a waveform previously acquired and stored by the test and measurement instrument 100. In other cases, the reference waveform may be loaded from an external memory device. FIG. 7, differently, illustrates an example of the object-oriented GUI 200 when a bus waveform has been added to the waveform viewing area 202 using the add new bus button 228. That is, rather than a reference waveform being displayed, the bus waveform is displayed in the waveform viewing area 202 and a corresponding bus badge 700 is added to the GSRB 204.

Figure 8:
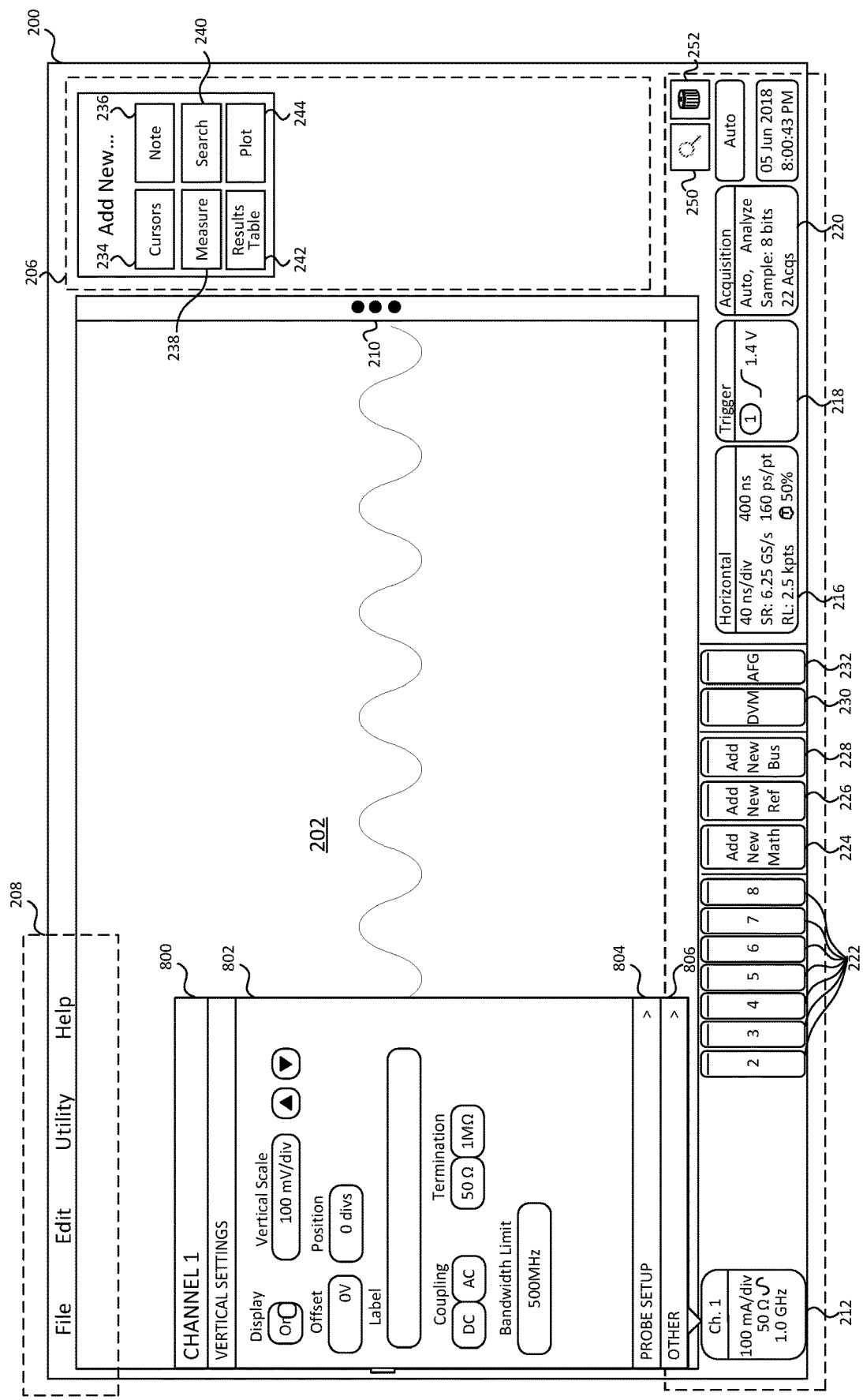
FIG. 8 illustrates an example of the object-oriented GUI with an expanded contextual menu displayed on the display of the test and measurement instrument of FIG. 1 according to some embodiments of the disclosure.

FIG. 8 illustrates an example of a user interacting with an object, an active channel badge 212 in the instance of FIG. 8. When a user selects the badge 212, for example by either double-tapping or double-clicking the badge 212, a contextual menu 800 is expanded in the viewing area 202 to allow a user to modify settings of the feature, function, or capability of the badge 212. The contextual menu 800 is shown originating from, and/or adjacent to, the associated badge 212.

The expanded contextual menu 800 may include additional menus, such as the vertical settings menu 802, shown expanded in FIG. 8, probe setup menu 804, and an other menu 806. Although not shown, both the probe setup menu 804 and the other menu 806 may be selected and expanded to change various characteristics related to channel one. In the instance of FIG. 8, the contextual menu 800 shows the settings for channel one. For instance, a user can select the vertical settings for displaying the waveform on channel one, may set or see the probe characteristics, or set other data as well by selecting the respective portion of the expanded contextual menu 800. In embodiments in which the test and measurement instrument 100 includes a touchscreen display, each portion and element of the contextual menu 800 may be sized appropriately, i.e. large enough, to provide easy and convenient touch targets for a user. In some embodiments, an expanded contextual menu, such as expanding contextual menu 800, may be displayed in a semi-transparent manner so that waveforms and other information behind the expanded contextual menu may still be partially visible.

Figure 9:
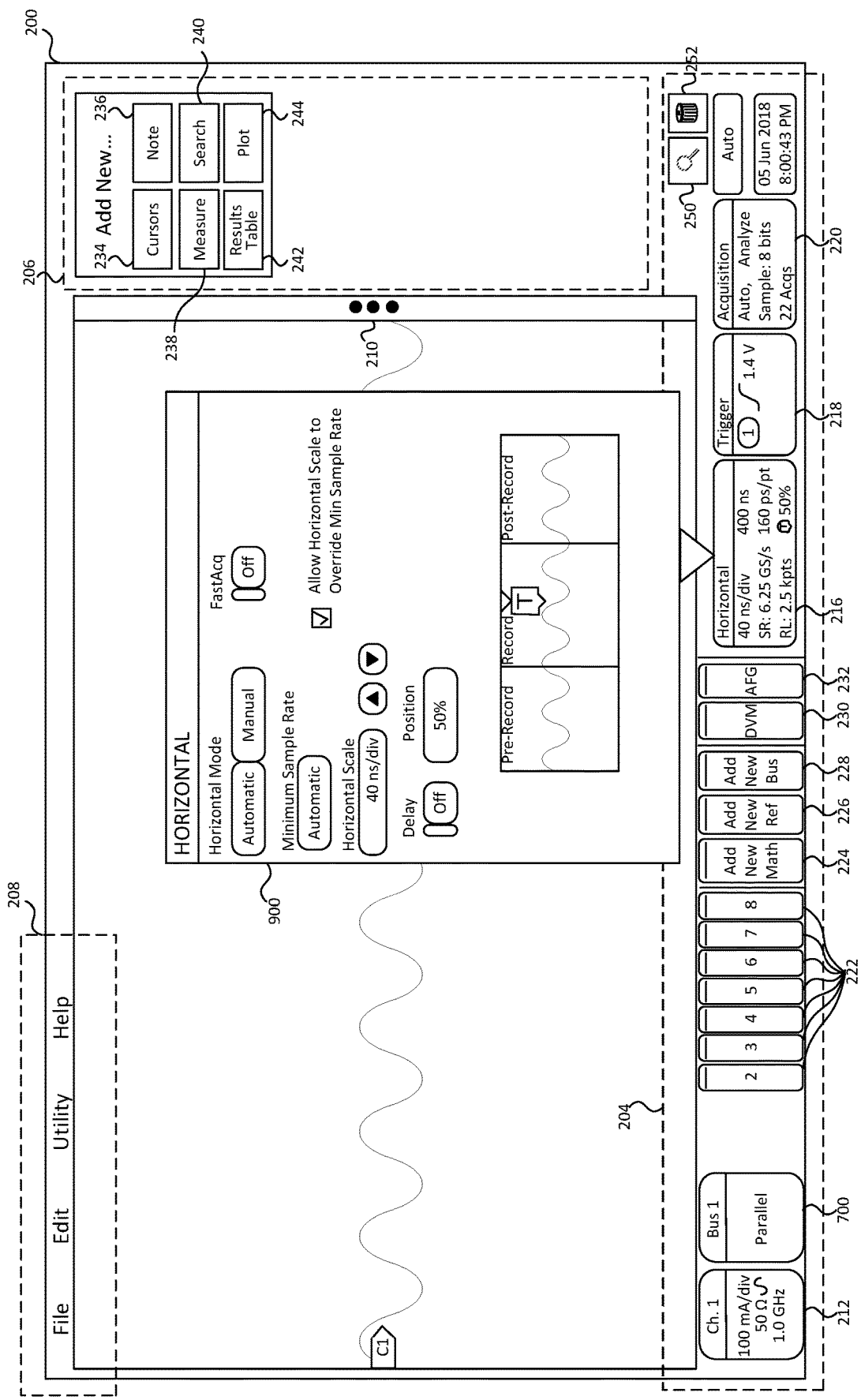
FIG. 9 illustrates an example of the object-oriented GUI with another expanded contextual menu displayed on the display of the test and measurement instrument of FIG. 1 according to some embodiments of the disclosure.

FIG. 9 illustrates an example of a user interacting with an object, specifically the horizontal settings badge 216 in the instance of FIG. 9. When a user selects the badge 216, for example, by either double-tapping or double-clicking the badge 216, a contextual menu 900 expands in the viewing area 202 to allow a user to modify settings of the function of the badge 216. Again, the contextual menu 900 is shown originating from, and/or adjacent to, the associated badge 216 in FIG. 9. That is, any contextual menu 900 that is displayed upon selecting a badge or button is displayed originating from, and/or adjacent to, the selected badge or button.

The example expanded contextual menu 900 shows the horizontal settings for the test and measurement instrument. For instance, a user can select a horizontal mode as automatic or manual, set a minimum sample rate, set the horizontal scale, etc. Any information a user may need to set for the test and measurement instrument 100 may be found in the expanded contextual menu 900 by double tapping or double clicking the badge 216.

Although not shown, each of the badges discussed above, such as, but not limited to, badges 212, 214, 216, 218, 220, 246, and 248 can be selected and an expanded contextual menu is displayed to set the settings of the functions associated with the selected badge. This allows a user to easily access and modify regularly used settings of the test and measurement instrument 100. Once a user has input all the information desired into the expanded contextual menu of the selected badge, a user may simply select anywhere on the object-oriented GUI 200 that is outside of the expanded contextual menu to close the expanded contextual menu. That is, a user need not select or find a small object, such as an "x" found on many conventional test and measurement user interfaces, to close the expanded contextual menu of any of the features of the test and measurement instrument 200. Rather, the user may merely select anywhere on the display outside the expanded contextual menu, such as the contextual menu 900, and the object-oriented GUI will close the expanded contextual menu.

Objects may also have expanded contextual menus, similar to those shown for badges 212 and 216. For example, if a user selects the new measurement object 238, an expanded measurement menu may be displayed on the object-oriented GUI 200 to allow a user to select the desired measurement. That is, an expanded contextual menu may be populated on the object-oriented GUI 200 for any of objects 234, 236, 238, 240, 242, and 244, for example. Expandable contextual menus are not limited to badges and objects, however, and any selectable component of the object-oriented GUI 200 may have an expandable contextual menu that is displayed to set any needed parameters of the selectable component. Further, a user may also double tap or double click the waveform viewing area 202 to expand a contextual menu associated with the waveform viewing area 202. This menu, however, is shown over the waveform viewing area 202, rather than adjacent to the waveform viewing area 202.

Figure 10:
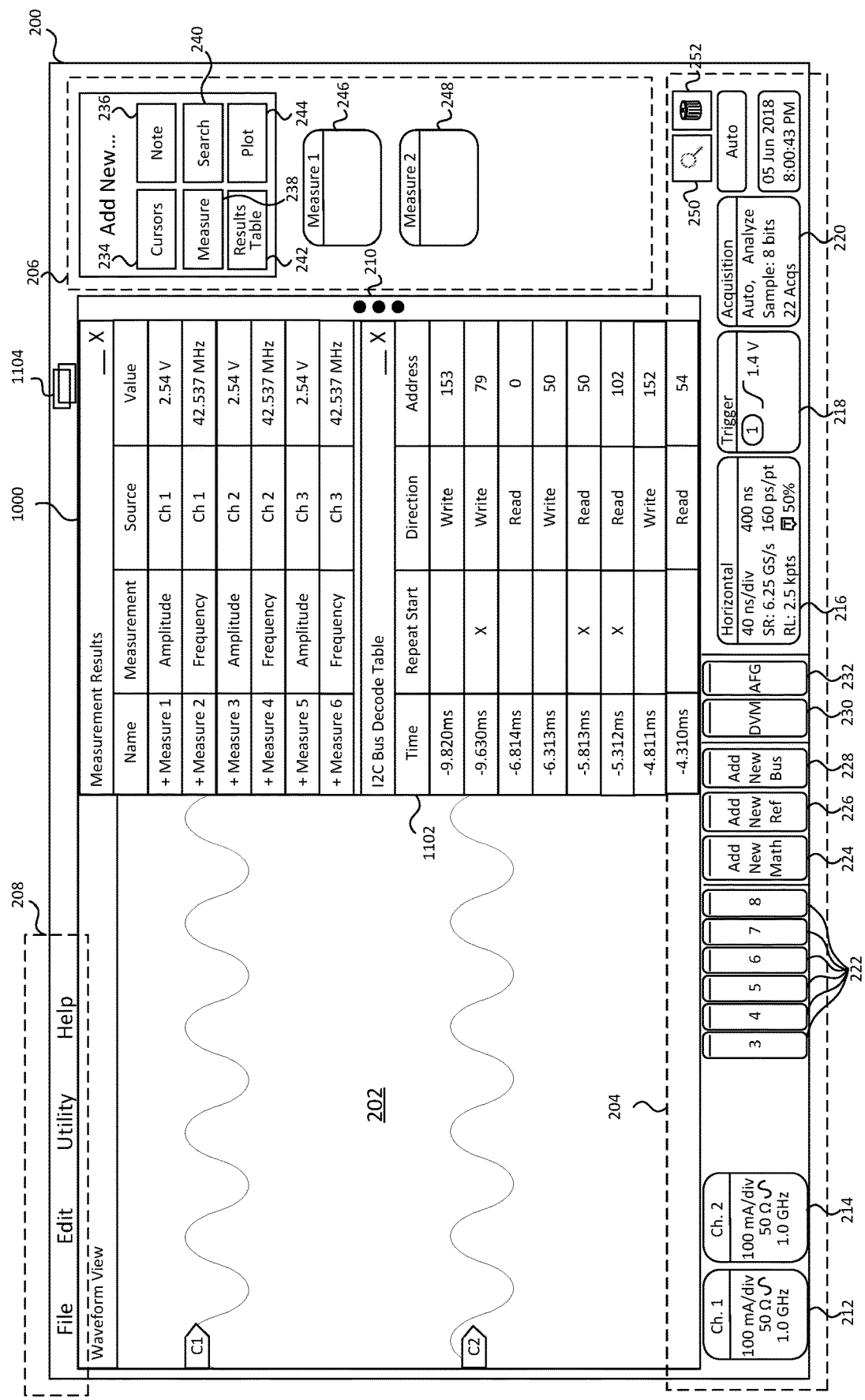
FIG. 10 illustrates an example of the object-oriented GUI with a results view displayed on the display of the test and measurement instrument of FIG. 1 according to some embodiments of the disclosure.

In some embodiments of the disclosure, a results view may be activated in the object-oriented GUI 200. This view may be activated, for example, by an expandable contextual menu related to the result. For example, measurement results are enabled in the expanded contextual menu of the measurement badge 246 or 248. In some embodiments, once opened, the measurement results views show results for all measurements, not just the measurement badge 246 or 248 it was enabled from. In other embodiments, only the result from the measurement badge 246 or 248 from which it is enabled is shown. Search results views may be enabled from a search result object 240 expanded contextual menu, and a serial decode result may be enabled from a serial bus expandable contextual menu. As shown in FIG. 10, the results 1000 and 1002 may be displayed concurrently with the waveform viewing area 202. That is, the results 1000 and 1002 may be shown in the same plane, but not overlapping, the waveform viewing area. The results 1000 and 1002 and the waveform viewing area 202 may each be moved and/or resized by a user, A thumbnail icon 1004 may be provided in the menu bar 208. If the thumbnail icon 1004 is selected, thumbnail preview of each of the results windows may be shown, which may be beneficial when multiple results windows are provided or have been reduced.

Figure 11:
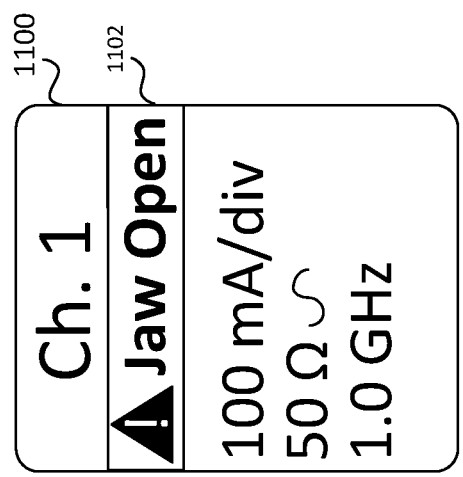
FIG. 11 illustrates an example badge of the object-oriented GUI having a warning.
Figure 12:
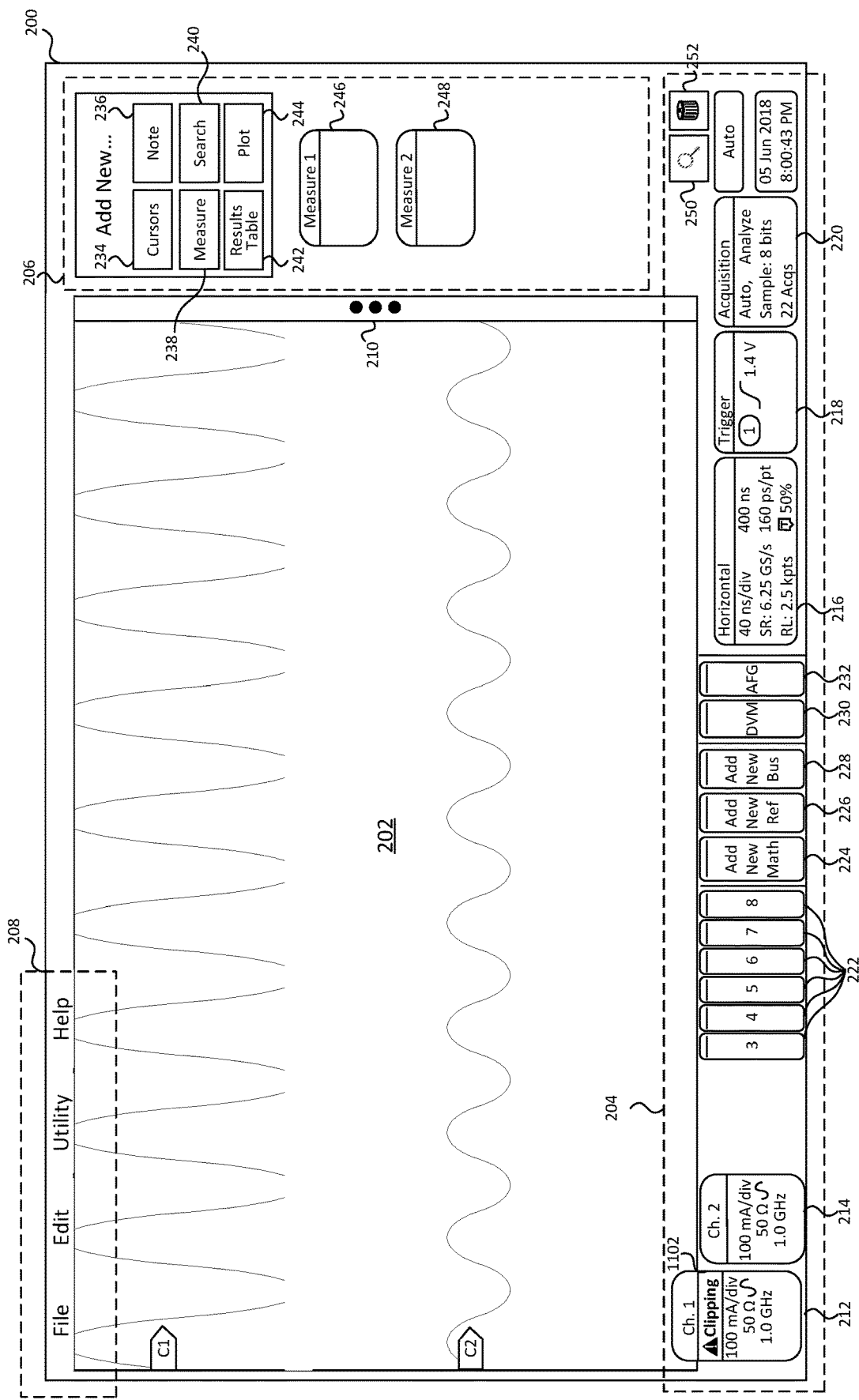
FIG. 12 illustrates an example of the object-oriented GUI having a badge with a warning displayed on the display of the test and measurement instrument of FIG. 1 according to some embodiments of the disclosure.

FIGS. 11 and 12 illustrate embodiments of the disclosure which may inform a user of critical information through a badge regarding either the safety or accuracy of a measurement being taken. In conventional test and measurement instruments, if a user needs to be notified of an important issue, then a popup message or dialog box will be displayed that either times out and automatically closes, or requires a user to manually acknowledge and close. However, once a user has dismissed this message, the information regarding the important issue is lost. If the user was to leave the test and measurement instrument and come back at a later time and forget the message, the user will not know that the condition which caused the message is still occurring. In other cases, the user may clear the message and another user begins to use the test and measurement instrument and the second user is then not aware of the issue.

Embodiments of the disclosure, especially as illustrated in FIGS. 11 and 12, address these deficiencies of the conventional test and measurement user interfaces. In the object-oriented GUI 200, a badge may be automatically expanded to reveal critical information to a user. For example, FIG. 11 illustrates an example channel badge 1100. As seen in FIGS. 2-10, a typical channel badge 212 includes only relevant information about the channel when it is functioning in a normal state. However, the example channel badge 1100 is indicating a critical issue of which the user should be aware. The example channel badge 1100 has been expanded to add a warning 1102 indicating to the user that there is an issue with channel one. In the case of FIG. 11, the channel badge 1100 indicates that a jaw of the current probe attached to channel one is open, which will lead to poor measurement results. A state of a probe connected to an input channel of the test and measurement instrument 100, for example, is important information to which the user should be alerted if it is not correct, since it will impact the integrity of measurement. The channel badge 1100 will continue to indicate the warning 1102 until the issue is resolved.

To generate the warning, the one or more processors 116 may receive a signal indicating that an error or safety signal is present. The component of the test and measurement instrument 100 or system that is experiencing the error or safety condition can send a signal to the one or more processors 116 indicating the error. The one or more processors 116, then determines which badge to automatically expand based on the error or safety condition being experienced. The one or more processors 116 may continue to receive information regarding the warning 1102, until the error the warning 1102 is related is resolved. For example, if a user modifies the settings of the test and measurement instrument 100 using the object-oriented GUI 200 to remove the signal clipping discussed in FIG. 12, then the warning 1102 is removed.

FIG. 12 illustrates the use of the warning on an object-oriented GUI 200. In this embodiment, the channel one badge 212 is now indicating that there is a critical issue with channel one and displays the warning 1102. As can be seen in FIG. 12, the channel one badge 212 is now expanded into the waveform viewing area 202 so that it may be very noticeable to a user. In the badge 212, the error identified by the warning 1102 is that the waveform is being clipped and is exceeding the limits of the test and measurement instrument's input. As soon as the issue is resolved, the warning 1102 will be removed from the channel one badge 212 and the channel one badge 212 will return to its normal size, as shown in FIGS. 2-10.

Although a probe condition and signal condition are shown in the warning 1102, any badge or object of the object-oriented GUI 200 may be expanded to include the warning 1102 for any error or safety conditions that may affect a measurement and/or any other function of the test and measurement instrument 100.

In FIGS. 11 and 12, the badges are shown in an expanded state in the vertical dimension to show the warning 1102. However, embodiments of the disclosure are not limited to this configuration. Rather, the badges may be expanded in the horizontal dimension or in both the horizontal and vertical dimensions. In some embodiments, a badge may be displayed with a 3-D effect, such as by adding a shadow, with the warning 1102. Other embodiments may include changing the displayed shape of the perimeter of a badge, such as by changing from a rounded rectangular perimeter to an oval, circle, star shape, etc.

Aspects of the disclosure may operate on particularly created hardware, firmware, digital signal processors, or on a specially programmed computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or computer-readable storage media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Examples

Illustrative examples of the technologies disclosed herein are provided below. An embodiment of the technologies may include any one or more, and any combination of, the examples described below.

Example 1 is a test and measurement instrument, comprising a display; and one or more processors configured to display on the display: a waveform viewing area with a vertical dimension and an adjustable horizontal dimension, the test and measurement instrument configured to display one or more waveforms in the waveform viewing area, a global settings readout bar located vertically adjacent to the waveform viewing area, the global settings readout bar including a first selectable information badge, wherein when the first selectable information badge is selected, displaying a first menu originating from the first selectable information badge to modify a setting of the test and measurement instrument related to the first selectable information badge.

Example 2 is the test and measurement instrument of example 1, further comprising a user input, wherein the one or more processors are further configured to move the first selectable information badge in response to the user input.

Example 3 is the test and measurement instrument of example 2, wherein at least one waveform of the one or more waveforms displayed in the waveform viewing area is associated with the first selectable information badge, and the one or more processors are further configured to remove the first selectable information badge and the at least one associated waveform from the waveform viewing area in response to a user input moving the first selectable information badge to a trash icon.

Example 4 is the test and measurement instrument of either one of examples 2 and 3, wherein the one or more processors are further configured to, when the first selectable badge is over a valid target, change an appearance of the first selectable information badge, and, if the first selectable information badge is released through the user input, perform a function in response to the first selectable badge being released over the valid target.

Example 5 is the test and measurement instrument of example 1, wherein the one or more processors are further configured to display a collapsible results readout bar located horizontally adjacent to the waveform viewing area, and wherein collapsing the collapsible results readout bar changes the horizontal dimension of the waveform viewing area.

Example 6 is the test and measurement instrument of example 5, wherein the collapsible results readout bar includes a second selectable information badge, wherein when the second selectable information badge is selected, displaying a second menu originating from the second selectable information badge to modify a setting of the test and measurement instrument related to the second selectable information badge.

Example 7 is the test and measurement instrument of example 6, further comprising a user input, wherein the one or more processors are further configured to move the second selectable information badge in response to the user input, and, when the second selectable badge is over a valid target, change an appearance of the second selectable information badge.

Example 8 is the test and measurement instrument of example 7, wherein when the second selectable information badge is released through the user input, performing a function in response to the second selectable badge being placed over the valid target.

Example 9 is the test and measurement instrument of any one of examples 1-8, wherein the global settings readout bar further includes a selectable button and when the selectable button is selected, displaying a waveform in the waveform viewing area associated with the selectable button and displaying a second selectable information badge, the second selectable information badge associated with the associated waveform.

Example 10 is the test and measurement instrument of example 9, wherein the selectable button is associated with an inactive channel of the test and measurement instrument and when the selectable button is selected, activating the channel associated with the selectable button and displaying the waveform on the channel in the waveform viewing area.

Example 11 is the test and measurement instrument of either one of examples 9 or 10, wherein the selectable button is associated with adding a math waveform of the test and measurement instrument and when the selectable button is selected, displaying a math waveform associated with the selectable button.

Example 12 is the test and measurement instrument of any one of examples 9-11, wherein the selectable button is associated with adding a reference waveform of the test and measurement instrument and when the selectable button is selected, displaying a reference waveform associated with the selectable button.

Example 13 is the test and measurement instrument of any one of examples 9-12, wherein the selectable button is associated with adding a bus waveform of the test and measurement instrument and when the selectable button is selected, displaying a bus waveform associated with the selectable button.

Example 14 is the test and measurement instrument of any one of examples 9-13, wherein when the second selectable information badge is selected, displaying a second menu adjacent to the second selectable information badge to modify a setting of the test and measurement instrument related to the second selectable information badge.

Example 15 is the test and measurement instrument of any one of examples 1-14, wherein the one or more processors are further configured to display a handle, wherein the horizontal dimension of the waveform viewing area is adjusted in response to a movement of the handle.

Example 16 is the test and measurement instrument of any one of examples 1-15, wherein the one or more processors are further configured to display a results view when a results view selection is made.

Example 17 is one or more computer-readable storage media comprising instructions, which, when executed by one or more processors of a test and measurement instrument, cause the test and measurement instrument to: display a waveform viewing area with a vertical distance and an adjustable horizontal distance; display one or more waveforms in the waveform viewing area; display a global settings readout bar located below the waveform viewing area, the global settings readout bar including a first selectable information badge, wherein when the first selectable information badge is selected, display a first menu adjacent the first selectable information badge to modify a setting of the test and measurement instrument related to the first selectable information badge; and display a collapsible results readout bar located horizontally adjacent to the waveform viewing area.

Example 18 is the one or more computer-readable storage media of example 17, further comprising instructions configured to cause the test and measurement instrument to move the first selectable information badge in response to a user input.

Example 19 is the one or more computer-readable storage media of example 18, further comprising instructions configured to cause the test and measurement instrument to remove the first selectable information badge and the associated waveform from the waveform viewing area in response to the user input moving the first selectable information badge to a trash icon.

Example 20 is the one or more computer-readable storage media of either one of examples 18 or 19, wherein when the first selectable badge is over a valid target, the instructions further cause the test and measurement instrument to change an appearance of the first selectable information badge.

Example 21 is the one or more computer-readable storage media of example 20, wherein when the first selectable information badge is released through the user input, the instructions further cause the test and measurement instrument to perform a function in response to the first selectable badge being placed over the valid target.

Example 22 is the one or more computer-readable storage media of any one of examples 17-21, wherein the collapsible results readout bar includes a second selectable information badge, when the second selectable information badge is selected, the instructions further cause the test and measurement instrument to display a second menu adjacent to the second selectable information badge to modify a setting of the test and measurement instrument related to the second selectable information badge.

Example 23 is the one or more computer-readable storage media of example 22, wherein the instructions further cause the test and measurement instrument to move the second selectable information badge in response to a user input, and wherein when the second selectable badge is over a valid target, changing an appearance of the second selectable information badge.

Example 24 is the one or more computer-readable storage media of either one of examples 22 or 23, wherein when the second selectable information badge is released through the user input, the instructions further cause the test and measurement instrument to perform a function in response to the second selectable badge being placed over the valid target.

Example 25 is the one or more computer-readable storage media of any one of examples 17-24, wherein the global settings readout bar further includes a selectable button and when the selectable button is selected, the instructions further cause the test and measurement instrument to display a waveform in the waveform viewing area associated with the selectable button and display a second selectable information badge, the second selectable information badge associated with the associated waveform.

Example 26 is the one or more computer-readable storage media of example 25, wherein the selectable button is associated with an inactive channel of the test and measurement instrument and when the selectable button is selected, the instructions further cause the test and measurement instrument to activate the channel associated with the selectable button and display the waveform on the channel in the waveform viewing area.

Example 27 is the one or more computer-readable storage media of either one of examples 25 or 26, wherein the selectable button is associated with adding a math waveform of the test and measurement instrument and when the selectable button is selected, the instructions further cause the test and measurement instrument to display a math waveform associated with the selectable button.

Example 28 is the one or more computer-readable storage media of any one of examples 25-27, wherein the selectable button is associated with adding a reference waveform of the test and measurement instrument and when the selectable button is selected, the instructions further cause the test and measurement instrument to display a reference waveform associated with the selectable button.

Example 29 is the one or more computer-readable storage media of any one of examples 25-28, wherein the selectable button is associated with adding a bus waveform of the test and measurement instrument and when the selectable button is selected, the instructions further cause the test and measurement instrument to display a bus waveform associated with the selectable button.

Example 30 is the one or more computer-readable storage media of any one of examples 25-29, wherein when the second selectable information badge is selected, the instructions further cause the test and measurement instrument to display a second menu adjacent to the second selectable information badge to modify a setting of the test and measurement instrument related to the second selectable information badge.

Example 31 is the one or more computer-readable storage media of any one of examples 17-30, wherein the instructions further cause the test and measurement instrument to display a marker, wherein the horizontal distance of the waveform viewing area moves in response to a movement of the marker.

Example 32 is the one or more computer-readable storage media of any one of examples 17-31, wherein the instructions further cause the test and measurement instrument to display a results view when a results view selection is made.

Example 33 is the method for providing a user interface of a test and measurement instrument, comprising: displaying a waveform viewing area with a vertical dimension and an adjustable horizontal dimension; displaying a waveform in the waveform viewing area, displaying a global settings readout bar located vertically adjacent to the waveform viewing area, the global settings readout bar including a first selectable information badge, and when the first selectable information badge is selected, displaying a first menu originating from the first selectable information badge to modify a setting of the test and measurement instrument related to the first selectable information badge.

Example 34 is the method of example 33, further comprising moving the first selectable information badge in response to a user input.

Example 35 is the method of example 34, removing the first selectable information badge and the associated waveform from the waveform viewing area in response to the user input moving the first selectable information badge to a trash icon.

Example 36 is the method of either one of examples 34 or 35, wherein when the first selectable badge is over a valid target, changing an appearance of the first selectable information badge.

Example 37 is the method of example 36, wherein when the first selectable information badge is released through the user input, the performing a function in response to the first selectable badge being placed over the valid target.

Example 38 is the method of any one of examples 33-38, further comprising displaying a collapsible results readout bar located horizontally adjacent to the waveform viewing area, the collapsible results readout bar including a second selectable information badge, and, when the second selectable information badge is selected, displaying a second menu originating from the second selectable information badge to modify a setting of the test and measurement instrument related to the second selectable information badge.

Example 39 is the method of example 38, further comprising moving the second selectable information badge in response to a user input, and, when the second selectable badge is over a valid target, changing an appearance of the second selectable information badge.

Example 40 is the method of either one of examples 38 or 39, further comprising, when the second selectable information badge is released through the user input, performing a function in response to the second selectable badge being placed over the valid target.

Example 41 is the method of any one of examples 33-40, wherein the global settings readout bar further includes a selectable button, further comprising, when the selectable button is selected, displaying a second waveform in the waveform viewing area, and displaying a second selectable information badge in the global settings readout bar, the second selectable information badge associated with the second waveform.

Example 42 is the method of example 41, wherein the selectable button is associated with an inactive channel of the test and measurement instrument, further comprising, when the selectable button is selected, activating the channel associated with the selectable button and displaying a portion of the input signal on the channel as the second waveform in the waveform viewing area.

Example 43 is the method of either one of examples 41 or 42, wherein the selectable button is associated with one of adding a math waveform, a reference waveform, or a bus waveform of the test and measurement instrument, further comprising, when the selectable button is selected, displaying a waveform associated with the selectable button as the second waveform in the waveform viewing area.

Example 44 is the method of any one of examples 41-43, wherein when the second selectable information badge is selected, displaying a second menu adjacent to the second selectable information badge to modify a setting of the test and measurement instrument related to the second selectable information badge.

Example 45 is the method of any one of examples 33-44, further comprising displaying a handle, wherein the horizontal distance of the waveform viewing area moves in response to a movement of the handle.

Example 46 is the method of any one of examples 33-45, further comprising displaying a results view when a results view selection is made.

Example 47 is a test and measurement instrument, comprising: a display; and one or more processors configured to: receive an error signal, and display on the display an icon associated with a function of the test and measurement instrument, and, when the error signal is received, display a warning symbol on the icon associated with the function of the test and measurement instrument until the error signal is removed.

Example 48 is the test and measurement instrument of example 47, wherein the error signal is associated with an error or safety condition of the test and measurement instrument.

Example 49 is the test and measurement instrument of either example 47 or 48, wherein the error signal is associated with clipping of an input signal to the test and measurement instrument.

Example 50 is the test and measurement instrument of any one of examples 47-49, wherein the error signal is associated with an issue with a probe connected to the test and measurement instrument.

Example 51 is the test and measurement instrument of any one of examples 47-50, wherein the one or more processors are further configured to display the icon partially obstructing a waveform viewing area.

Example 52 is the test and measurement instrument of any one of examples 47-51, wherein the warning symbol includes an indication of a type of error signal.

Example 53 is a method for alerting a user of an error in a test and measurement instrument, comprising: receiving an error signal; displaying on a display an icon associated with a function of the test and measurement instrument; and when the error signal is received, displaying a warning symbol on the icon associated with the function of the test and measurement instrument until the error signal is removed.

Example 54 is the method of example 53, wherein the error signal is associated with an error or safety condition.

Example 55 is the method of either example 53 or 54, wherein the error signal is associated with clipping of a signal.

Example 56 is the method of any one of examples 53-55, wherein the error signal is associated with an issue with a probe.

Example 57 is the method of any one of examples 53-56, wherein the icon is displayed partially obstructing a waveform viewing area.

Example 58 is the method of any one of examples 53-57, wherein the warning symbol includes an indication of a type of error signal.

Example 59 is one or more computer-readable storage media comprising instructions, which, when executed by one or more processors of a test and measurement instrument, cause the test and measurement instrument to: receive an error signal; display on a display an icon associated with a function of the test and measurement instrument; and when the error signal is received, display a warning symbol on the icon associated with the function of the test and measurement instrument until the error signal is removed.

Example 60 is the one or more computer-readable storage media of example 59, wherein the error signal is associated with an error or safety condition.

Example 61 is the one or more computer-readable storage media of either one of examples 59 or 60, wherein the error signal is associated with clipping of a signal.

Example 62 is the one or more computer-readable storage media of any one of examples 59-61, wherein the error signal is associated with an issue with a probe.

Example 63 is the one or more computer-readable storage media of any one of examples 59-62, wherein the icon is displayed partially obstructing a waveform viewing area.

Example 64 is the one or more computer-readable storage media of any one of examples 59-63, wherein the warning symbol includes an indication of a type of error signal.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

I claim:

1. A test and measurement instrument, comprising:
a display; and
one or more processors configured to:
receive an error signal, and
display on the display an icon associated with a function of the test and measurement instrument, and, when the error signal is received, change a dimension of the icon from an original value to display the icon partially obstructing a waveform viewing area on the display and display a warning symbol on the icon associated with the function of the test and measurement instrument until the error signal is removed.

2. The test and measurement instrument of claim 1, wherein the error signal is associated with an error or safety condition of the test and measurement instrument.

3. The test and measurement instrument of claim 1, wherein the error signal is associated with clipping of an input signal to the test and measurement instrument.

4. The test and measurement instrument of claim 1, wherein the error signal is associated with an issue with a probe connected to the test and measurement instrument.

5. The test and measurement instrument of claim 1, wherein the one or more processors are further configured to display the warning symbol in a portion of the icon that is partially obstructing the waveform viewing area.

6. The test and measurement instrument of claim 1, wherein the warning symbol includes an indication of a type of error signal.

7. The test and measurement instrument of claim 1, wherein changing a dimension of the icon from an original value comprises increasing a vertical dimension of the icon.

8. The test and measurement instrument of claim 7, wherein the one or more processors are further configured, when the error signal is removed, to revert the dimension of the icon to the original value to display the icon without obstructing the waveform viewing area.

9. The test and measurement instrument of claim 1, wherein the one or more processors are further configured to, when the error signal is received, change the icon from an original shape to a modified shape.

10. The test and measurement instrument of claim 9, wherein the one or more processors are further configured, when the error signal is removed, to revert the icon to the original shape.

11. A test and measurement instrument, comprising:
an input channel;
a display; and
one or more processors configured to display on the display
a waveform viewing area to display one or more waveforms,
a channel badge associated with the input channel, the channel badge including information associated with at least one waveform of the one or more waveforms displayed in the waveform viewing area, the channel badge having a perimeter that does not obstruct the waveform viewing area and
the one or more processors further configured to receive an error signal associated with the input channel, and, when the error signal is received, change the perimeter of the channel badge to partially obstruct the waveform viewing area, and display a warning symbol on the channel badge until the error signal is removed.

12. The test and measurement instrument of claim 11, wherein the error signal is associated with an error or safety condition of the test and measurement instrument.

13. The test and measurement instrument of claim 11, wherein the error signal is associated with clipping of an input signal to the input channel.

14. The test and measurement instrument of claim 11, wherein the error signal is associated with an issue with a probe connected to the input channel.

15. The test and measurement instrument of claim 11, wherein the warning symbol includes an indication of a type of error signal.

16. The test and measurement instrument of claim 11, wherein the one or more processors are further configured to, when the error signal is received, display the warning symbol in a portion of the channel badge that is partially obstructing the waveform viewing area.

17. The test and measurement instrument of claim 16, wherein the one or more processors are further configured to, when the error signal is removed, change the perimeter of the channel badge to not obstruct the waveform viewing area.

18. A method comprising:
displaying a waveform viewing area on a display of a test and measurement instrument;
displaying a waveform in the waveform viewing area, the waveform representing an input signal received at an input channel of the test and measurement instrument;
displaying a channel badge associated with the input channel on the display, the channel badge including information associated with the waveform, the displayed channel badge not obstructing the waveform viewing area;
receiving an error signal associated with an error or safety condition of the test and measurement instrument; and
modifying the displayed channel badge by expanding a dimension of the displayed channel badge to partially obstruct the waveform viewing area in response to the error signal until the error signal is removed.

19. The method of claim 18, wherein the error signal is associated with one of clipping of the input signal or an issue with a probe connected to the input channel.

20. The method of claim 18, further comprising displaying a warning symbol in the expanded displayed channel badge in response to the error signal until the error signal is removed.

* * * * *